United States Patent
Bains et al.

(10) Patent No.: US 9,843,492 B2
(45) Date of Patent: Dec. 12, 2017

(54) ETHERNET DATA RATE SELECTION BASED ON CABLE PARAMETERS

(71) Applicant: Cisco Technology, Inc., San Jose, CA (US)

(72) Inventors: Amrik Singh Bains, Livermore, CA (US); Kenneth Christian Naumann, Livermore, CA (US); Samir Bouadjel, Los Gatos, CA (US)

(73) Assignee: Cisco Technology, Inc., San Jose, CA (US)

( * ) Notice: Subject to any disclaimer, the term of this patent is extended or adjusted under 35 U.S.C. 154(b) by 130 days.

(21) Appl. No.: 14/686,955

(22) Filed: Apr. 15, 2015

(65) Prior Publication Data

US 2016/0308742 A1    Oct. 20, 2016

(51) Int. Cl.
| | |
|---|---|
| H04L 12/26 | (2006.01) |
| G06F 11/07 | (2006.01) |
| H03M 13/11 | (2006.01) |
| H04L 1/00 | (2006.01) |
| H04B 3/487 | (2015.01) |
| H04L 25/03 | (2006.01) |

(52) U.S. Cl.
CPC ........ *H04L 43/0841* (2013.01); *G06F 11/076* (2013.01); *G06F 11/0709* (2013.01); *H03M 13/1102* (2013.01); *H04B 3/487* (2015.01); *H04L 1/0001* (2013.01); *H04L 25/03006* (2013.01); *H04L 25/03057* (2013.01)

(58) Field of Classification Search
None
See application file for complete search history.

(56) References Cited

U.S. PATENT DOCUMENTS

| | | | | |
|---|---|---|---|---|
| 5,550,836 | A * | 8/1996 | Albrecht | H04L 5/143 370/447 |
| 5,920,705 | A * | 7/1999 | Lyon | H04L 12/4608 370/409 |
| 9,203,730 | B1 | 12/2015 | Johnson et al. | |
| 2001/0038674 | A1* | 11/2001 | Trans | H04B 1/00 375/355 |
| 2006/0082377 | A1 | 4/2006 | Bolouri-Saransar et al. | |

(Continued)

FOREIGN PATENT DOCUMENTS

EP    0651465 A2    5/1995

OTHER PUBLICATIONS

European Extended Search Report dated Aug. 4, 2016 cited in Application No. 16162053.9, 16 pgs.

(Continued)

*Primary Examiner* — Huy D Vu
*Assistant Examiner* — Hong Shao
(74) *Attorney, Agent, or Firm* — Merchant & Gould P.C.

(57) ABSTRACT

Methods and systems are disclosed which can perform cable characterization at link-up and during in-service monitoring to provide the best data throughput. In some embodiments a plurality of frequency tones may be sent across a cable to a remote system. A plurality of return loss values associated with sending the plurality of frequency tones may then be measured and stored. Next, a crosstalk value across the cable may be computed. A quality value for the cable may then be determined based on at least the plurality of return loss values and the crosstalk value.

20 Claims, 5 Drawing Sheets

(56) References Cited

U.S. PATENT DOCUMENTS

| | | |
|---|---|---|
| 2008/0105449 A1 | 5/2008 | Kenny et al. |
| 2009/0073990 A1 | 3/2009 | Patil et al. |
| 2009/0097393 A1* | 4/2009 | Diab .................. H04B 3/32 370/201 |
| 2010/0051692 A1 | 3/2010 | Knudson et al. |
| 2014/0119381 A1 | 5/2014 | Diab et al. |

OTHER PUBLICATIONS

Lewis, Unconfirmed Meeting Minutes: IEEE 802.3 NGEABT Study Group, Jan. 14-15, 2015, Atlanta, GA, 13 pgs.
Brillhart, Fluke Networks, "Survey of ~60,000 Installed and Tested Cabling Links," Mar. 2015, 9 pgs.
Maguire, "IEEE 802.3 Ethernet Working Group TIA TR-42 Liaison to IEEE 802.3," The Siemon Company, Dallas, TX, Nov. 9, 2015, pp. 1-20.
Panduit Technology Brief, "Cabling Infrastructure Choice for 2.5 and 5BASE-T over Copper," COTB07—WW-ENG, Rev. 1, Apr. 2016, 6 pgs.

* cited by examiner

ETHERNET DATA RATE SELECTION BASED ON CABLE PARAMETERS

TECHNICAL FIELD

The present disclosure relates generally to network cable configuration and management, specifically, the characterization of cables at link-up times and during in-service monitoring to provide improved data throughput.

BACKGROUND

In traditional Institute of Electrical and Electronics Engineers (IEEE) 802.3 Ethernet standards, such as Gigabit Ethernet (1 GE) and 10 Gigabit Ethernet (10 GE), data rates may be defined. The data rates may be based on specified cable types, electromagnetic noise that can occur in a cable that runs alongside one or more other signal-carrying cables (alien crosstalk), and cable length. For example, 1000 Base-T (which is a standard for 1 GE, also known as 802.3ab) specifies a maximum cable length of 100 meters using Category 5 cable or better. Alternatively, 10 G Base-T (which is a standard for 10 GE, also known as 802.3an) specifies a maximum cable length of 100 meters using Category 6a cable or better. Under the 10 G Base-T standard, alien crosstalk may be handled by a required cable bundle of six cables grouped around a single cable.

In most Enterprise Access networks, conditions may or may not meet the specified standards. When conditions are worse than desired, it may result in unreliable performance for end users. On the other hand, conditions better than specified may result in limiting the deployment options of the network. In prior systems, Telecommunications Industry Association (TIA) Engineering Committee TR-42 has proposed performing cable characterization tests on cable at the time of cable installation. Gathered characterization data may then be used to determine possible data rates that can be used while still providing reliable performance.

However, upon the application of multi-Gig (mGig) standards, such as IEEE Next Generation Enterprise Access BASE-T (NGEABT—802.3bz) over currently installed cables, the cable data will be unknown for new data rates (such as 2.5 G and 5 G). For example, the NGEABT standard may provide multi-rate 2.5 G/5 G standard for 802.11ac Wave 2. Such standard application may lead to at least two problems upon installation. First, data rate performance on the network links upon startup may be negatively affected. Furthermore, dynamic noise conditions caused by alien cross talk as well as variations due to temperature, voltage, and link speed changes amongst the aggressors in a particular cabling arrangement (for example, in a cable bundle of six cables grouped around a single cable, the six cables are aggressor cables, while the single cable may be referred to as the victim cable.

Prior approaches have attempted to re-characterize previously installed cables to determine 2.5 G or 5 G data rate selection. However, such an approach may be very costly due to the large currently installed base number of Cat 5e and Cat 6 cables.

BRIEF DESCRIPTION OF THE FIGURES

The accompanying drawings, which are incorporated in and constitute a part of this disclosure, illustrate various embodiments of the present disclosure. In the drawings.

DETAILED DESCRIPTION

Overview

Methods and systems are disclosed which can perform cable characterization at link-up and during in-service monitoring to provide the best data throughput. In some embodiments a plurality of frequency tones may be sent across a cable to a remote system. A plurality of return loss values associated with sending the plurality of frequency tones may then be measured and stored. Next, a crosstalk value across the cable may be computed. A quality value for the cable may then be determined based on at least the plurality of return loss values and the crosstalk value.

Both the foregoing overview and the following example embodiment are examples and explanatory only, and should not be considered to restrict the disclosure's scope, as described and claimed. Further, features and/or variations may be provided in addition to those set forth herein. For example, embodiments of the disclosure may be directed to various feature combinations and sub-combinations described in the example embodiment.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

Figure 1:
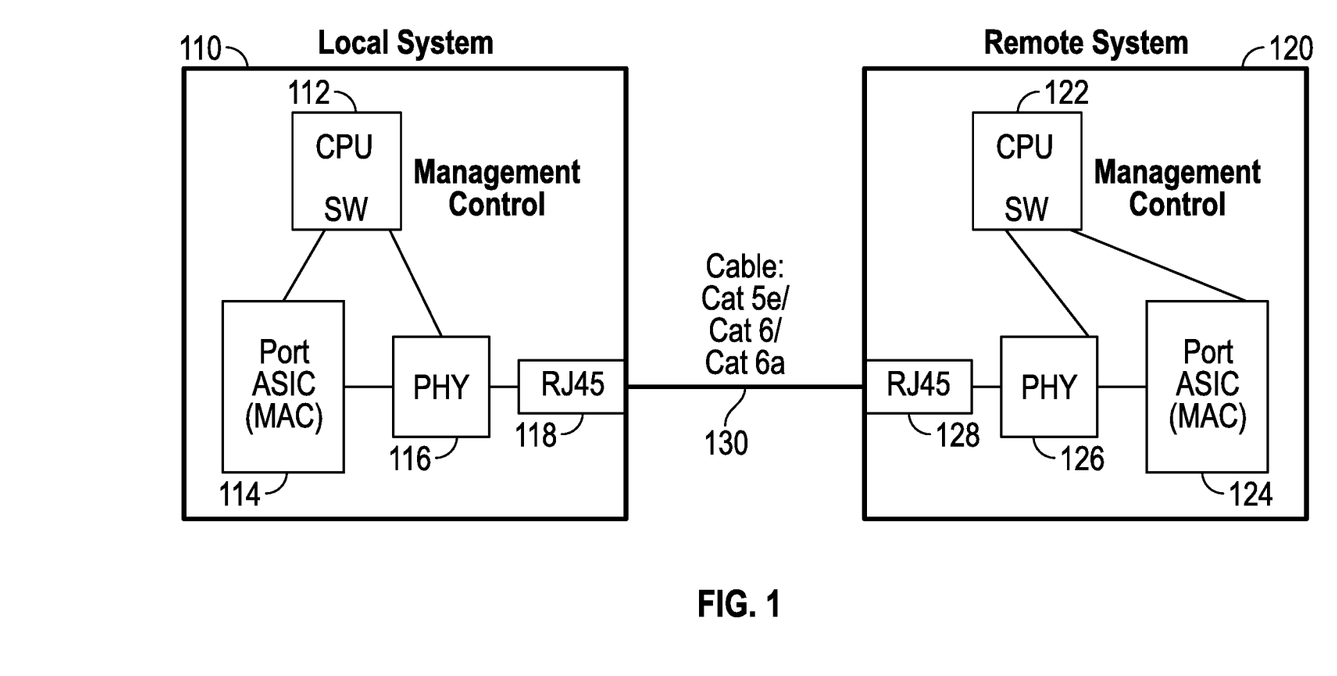
FIG. 1 illustrates a sample network topology where embodiments of the present disclosure may be performed.

FIG. 1 illustrates a sample network topology that will be used in the following description to illustrate embodiments of the present disclosure. The described network topology may exist in a networking environment 100. For example, networking environment 100 may be any type of system that transmits data packets over a network. As an example, networking environment 100 may be an environment enabled to provide voice communications, and video and data services.

Networking environment 100 may be based on a bi-directional transfer of packet based service, such as Internet Protocol (IP) traffic, between any number of network devices. Networking environment 100 may further include a plurality of gateways (not shown), for example, but not limited to cable modems, routers, switches, set top boxes, and computers. Networking environment 100 may include any combination of wide area networks (WANs), local area networks (LANs), or other networks suitable for packet-type communications, such as Internet communications.

Networking environment 100 may be designed to transmit a stream of data packets from one network device to other network devices. Networking environment 100 may comprise any number of network devices both inside and outside the confines of fabric 110. Network devices may be routers, bridges, fabric edge nodes, or other network devices capable of receiving and transmitting a data stream from a source network device to a destination network device. Specifically, in embodiments of the present disclosure any of the described network devices may operate the disclosed embodiments of the present disclosure. Similarly, local system 110 and remote system 120 may be found on network devices within networking environment 100. Network devices generally are discussed in further detail in regards to FIG. 3.

A local system 110 may be a network device connected to a remote system 120 over an Ethernet cable 130. In some embodiments of the present disclosure, Ethernet cable 130 may be a Cat 5e, Cat6, or Cat6a cable. Local system 110 may comprise a CPU 112 capable of running software to execute embodiments of data rate selection. CPU 112 may be in communication with a local port application-specific integrated circuit (Port-ASIC) 114. CPU 112 and local Port-ASIC 114 may further be in communication with a local physical (PHY) network device layer 116. Local PHY network device layer 116 may be further in communication with a registered jack (RJ) port, such as a RJ45 port 118.

Similarly, remote system 120 may comprise a CPU 122 capable of running software to execute embodiments of data rate selection. CPU 122 may be in communication with a remote port application-specific integrated circuit (Port-ASIC) 124. CPU 122 and remote Port-ASIC 124 may further be in communication with a remote physical (PHY) network device layer 126. Remote PHY network device layer 126 may be further in communication with a registered jack (RJ) port, such as a RJ45 port 128.

At power-up of a network device such as local system 110 or during a physical link-up between local system 110 and remote system 120, cable characterization may be performed to measure cable parameters of a cable such as Ethernet cable 130 prior to starting a standard auto-negotiation process. Once the quality level and the type of Ethernet cable 130 are determined, local PHY network device layer 116 may operate to restrict auto-negotiation ability parameters to levels that can be reliably supported based on the determined conditions.

A non-exhaustive list of parameters that may be determined during the cable characterization includes: a half power point (3 dB bandwidth) determination, cable attenuation (insertion loss), cable return loss, and detected crosstalk. Once remote system 120 is powered-up, local PHY network device layer 116 may perform testing by sending frequency tones on each set of 4-wire pairs. In some embodiments, the frequency tones may range from 10 MHz to 500 MHz with 10 MHz steps. Remote PHY network device layer 126 may store the amplitude of the different frequencies in a local static random access memory (SRAM) associated with the remote system 120.

Concurrently, local PHY network device layer 116 may measure the return loss and store the return loss information into the local SRAM. Furthermore, the crosstalk occurring between local system 110 and remote system 120 may be computed. Notably, discernable differences in crosstalk may distinguish between Cat 6A cabling versus Cat6 and Cat5e cabling.

Once the above cable characteristics have been gathered, embodiments of the present disclosure may perform auto-negotiation at 1 GE. The auto-negotiation may employ extended Organizationally Unique Identifiers (OUIs) to handle identifying exchange insertion loss and return loss values between local PHY network device layer 116 and remote PHY network device layer 126. Software operating an operating system (such as Internetwork Operating System [IOS]) on CPU 112 may read the recommended maximum data rates and start final auto-negotiation.

During network operation, signal-to-noise ratios (SNR), low density parity checks (LDCP), and bit error rates (BER) may each be monitored across Ethernet cable 130. These monitored values may be used to help avoid issues if there are dynamic changes in alien crosstalk or other impactful changes in network environment 100. For example, in some embodiments, BER is maintained at a level between $1\times10e^{-10}$ to $1\times10e^{-12}$. As part of this feature, a fast re-train may be employed to re-optimize a Fast Ethernet adapter associated with a network device. In some embodiments, the fast re-train may result in a new set of Digital Feedback Equalization (DFE) feedback coefficients sent to the network device.

In some situations, the rate of fast re-trains is too quick (for example, occurring every second). In this scenario, a speed shift down procedure may be started that includes sending messages to remote PHY network device layer 126 and to local Port-ASIC 114. Assuming acceptable BER levels, some embodiments may send messages to remote PHY network device layer 126 via auxiliary channel bits (AUX bit) found in a frame with 16 discrete levels of pulse amplitude modulation (16-PAM). In some embodiments, two AUX bits in the 16-PAM frame may be used to express values corresponding to 100M, 1 G, 2.5 G, 5 G, and 10 G speeds. For example, 000 may indicate 100M, 001 may indicate 1 G, 010 may indicate 2.5 G, 011 may indicate 5 G, and 100 may indicate 10 G.

Subsequently, local Port-ASIC 114 may update a Transmit-configuration status register at local PHY network device layer 116. Local Port-ASIC 114 may further send a current transmit congestion status word. In some embodiments, the current transmit congestion status word may be configured to indicate one of a plurality of congestion levels. Finally, local Port-ASIC 114 may generate an interrupt containing at least an interrupt reason and an interrupt mask register value.

In embodiments where the BER is at an acceptable value for a predetermined time span, and where there are no fast re-trains occurring, local PHY network device layer 116 may advertise a speed up command to increase the speed of the associated Ethernet card at local Port-ASIC 114 and remote PHY network device layer 126. All auto-negotiation modes may be user-configurable via Management Data Input-Output (MDIO) registers.

Figure 2:
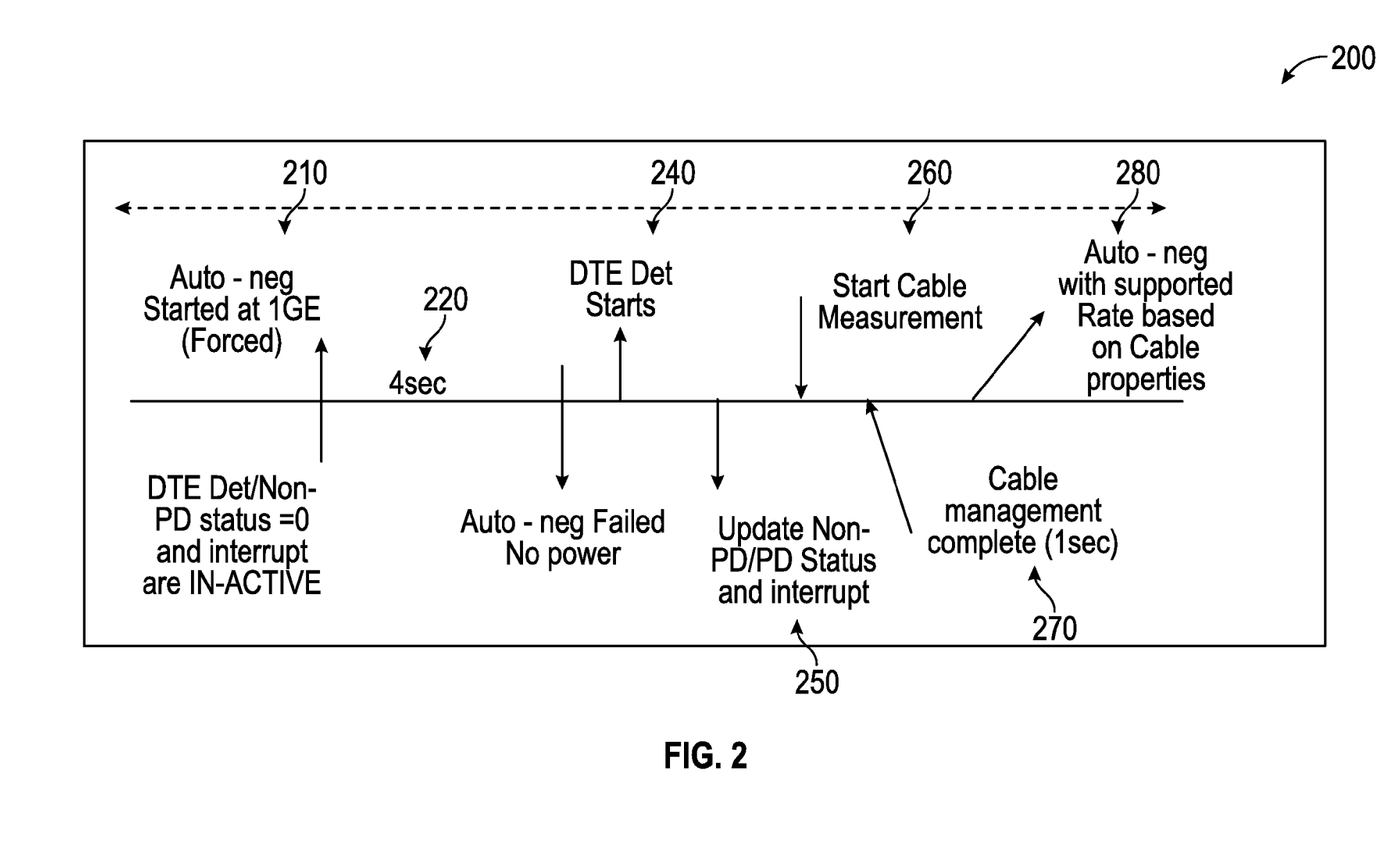
FIG. 2 illustrates a sequence where embodiments of the present disclosure may be performed.

Turning to FIG. 2, embodiments of a bring-up process 200 for remote system 120. First, it may be determined whether remote system 120 is powered or if remote system 120 requires power to be provided by local system 110. In some embodiments, local system 110 may supply such power through Power over Ethernet (PoE). At stage 210, local system 110 may set Data Terminal Equipment (DTE) powered device (PD), Non-PD, and Link Status/Interrupt values to 0. This may set the Interrupt status to inactive. Furthermore, at stage 210 local system 110 may start a forced auto-negotiation for a 1 GE data rate.

If the auto-negotiation is successful, then it may be determined that remote system 120 does not require PoE. Subsequently, process 200 may proceed to stage 260. If the auto-negotiation hangs for a period of time 220 (for example, ~four seconds), the auto-negotiation may be deemed unsuccessful, then it may be determined at stage 230 that remote system 120 does not have power.

If remote system 120 does not have power, process 200 may proceed to stage 240. At stage 240, IEEE standard DTE algorithms may be employed by local PHY network device layer 116 to determine the DTE type of remote system 120. In some embodiments the DTE algorithm may indicate a powered or non-powered status for remote system 120 based on bandwidth and return loss measurements.

At stage 250, the PD and non-PD status values may be set. For example, if remote system 120 is non-PD, local PHY network device layer 116 may set non-PD status to 1 and PD status to 0. Alternatively, if remote system 120 is PD, local PHY network device layer 116 may set non-PD status to 0 and PD status to 1. After stage 250, CPU 112 may determine an amount of power to be supplied to remote system 120. In some embodiments, the power determination may be based on a higher level protocol, such as Link Layer Discovery Protocol (LLDP).

Next, process 200 may proceed to stage 260 where cable characterization may commence as both local system 110 and remote system 120 are powered. In embodiments of the present disclosure, cable characterization may occur prior to the selection of the operating data speed via auto-negotiation.

Cable characterization may measure 3 dB bandwidth, insertion loss and return loss parameters. First, local PHY network device layer 116 may send frequency tones from 10 MHz to 500 MHz in 10 MHz steps. Remote PHY network device layer 126 may store the recorded amplitude associated with each of the frequencies. In some embodiments, the amplitudes may be stored in a local SRAM in remote system 120. Next, local PHY network device layer 116 may measure and store the subsequent return loss values. In some embodiments, the return loss values may be stored in a local SRAM in local system 110.

Process 200 may then proceed to stage 260. At stage 260, local PHY network device layer 116 may perform auto-negotiation at 1 GE. This auto-negotiation may employ extended OUIs to handle identifying exchange insertion loss and return loss values between local PHY network device layer 116 and remote PHY network device layer 126. The IOS software on CPU 112 and CPU 122 may both read the recommended maximum data rates and start final auto-negotiation at the determined optimum data rate.

Figure 3:
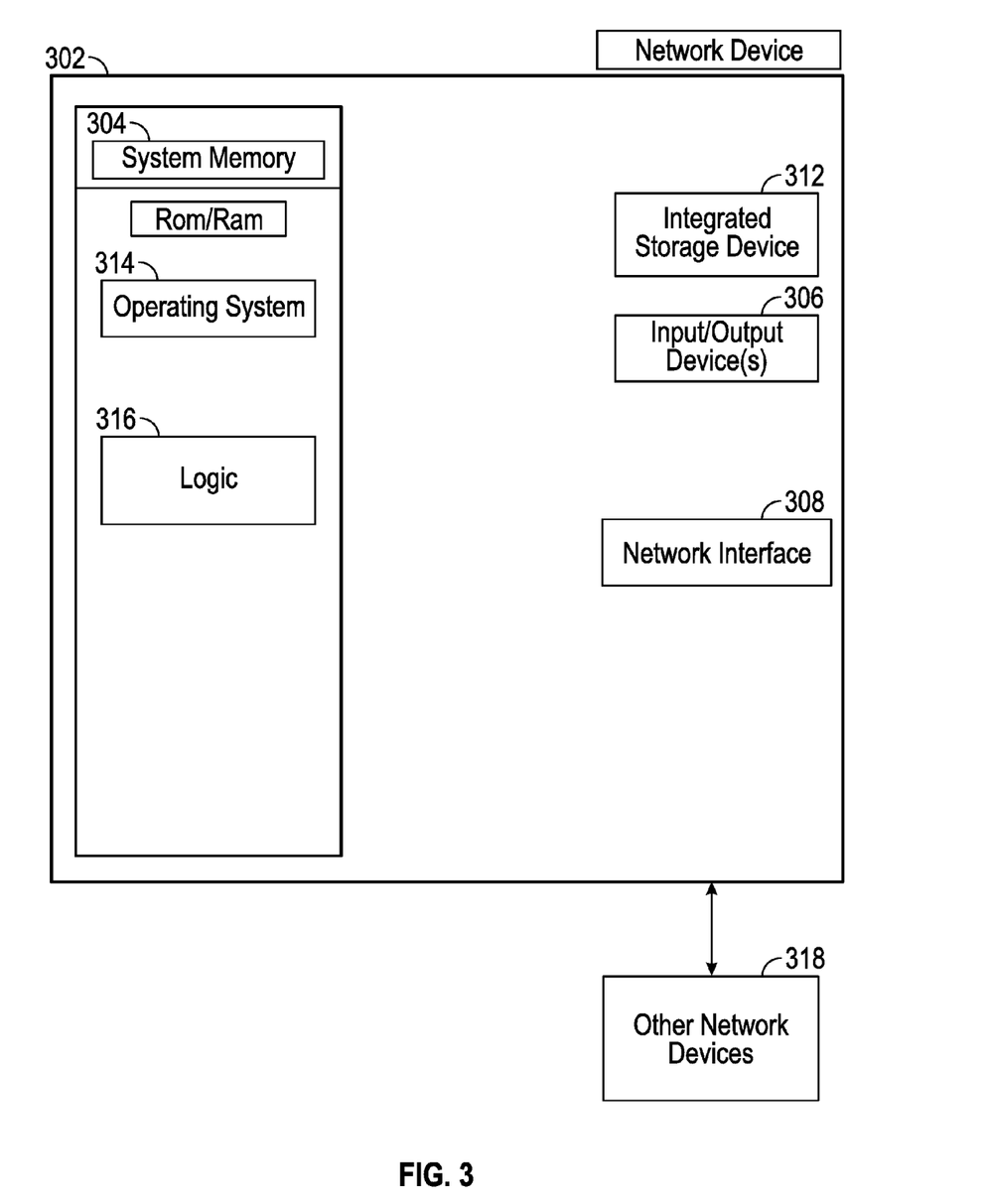
FIG. 3 shows a network device in greater detail.

FIG. 3 shows a network device (such as local system 110) in greater detail. A network device may include a processing device 302, a memory 304, input/output (I/O) devices 306, and a network interface 308, each of which may be communicatively coupled via a local interface (not shown). Processing device 302 may be a hardware device for executing software, particularly that which is stored in memory 304. Processing device 302 may be any custom made or commercially available processor, a central processing unit (CPU), an auxiliary processor among several processors, a semiconductor-based microprocessor (in the form of a microchip or chip set), a microprocessor, or generally any device for executing software instructions. Software executed by processing device 302 may include software at least capable of operating described embodiments of the present disclosure.

Network interface 308 may include one or more devices that communicate both inputs and outputs, for instance but not limited to, a modulator/demodulator (modem for accessing another device, system, or network), a radio frequency (RF) transceiver or other type of transceiver, a telephonic interface, a bridge, a router, etc.

I/O devices 306 may include input devices, for example but not limited to, a keyboard, mouse, scanner, microphone, etc. Furthermore, the I/O devices 206 may also include output devices, for example but not limited to, a printer, display, etc.

The local interface may be, for example but not limited to, one or more buses or other wired or wireless connections. The local interface may have additional elements, which are omitted for simplicity, such as controllers, buffers (caches), drivers, repeaters, and receivers, to enable communications. Further, local interface 310 may include address, control, and/or data connections to enable appropriate communications among the aforementioned components and provides the interface to communicate with a network controller, a host tracking database, a fabric edge router, or any number of other network devices in networking environment 100.

In some embodiments, a network device may further be configured with an integrated storage device 312 coupled to local interface 310. Storage device 312 may be configured to buffer a plurality of data packets. One or more such buffers may be dedicated buffers for storing captured packets. In some embodiments, storage device 312 may be externally coupled to a content server (not shown).

Memory 304 may include a suitable operating system (O/S) 314. Operating system 314 essentially may control the execution of other computer programs, such as scheduling, input-output control, file and data management, memory management, and communication control and related services. Logic 316 may include executable code to send service requests to the local system, the remote system, a fabric edge router, or any number of other network devices in networking environment 100.

Memory 304 may include any one or combination of volatile memory elements (e.g., random access memory (RAM, such as DRAM, SRAM, SDRAM, etc.)) and non-volatile memory elements (e.g., ROM, hard drive, tape, CDROM, etc.). Moreover, the memory 304 may incorporate electronic, magnetic, optical, semi-conductive, and/or other types of storage media. Note that memory 304 may have a distributed architecture, where various components are situated remotely from one another, which can be accessed by the processing device 302.

The software in memory 304 may include one or more separate programs, each of which comprises an ordered listing of executable instructions for implementing logical functions. In the embodiment shown in FIG. 3, the software in memory 304 may include operating system 314 and logic 316, as explained above. Functionality of logic 316 may be implemented using a single module, or distributed among a plurality of modules.

When logic 316 is in operation, processing device 302 may be configured to execute logic 316 stored within memory 304, to communicate data to and from memory 304, and to generally control operations of logic 316. Logic 316 and O/S 314, in whole or in part, but typically the latter, are read by processing device 302, perhaps buffered within processing device 302, and then executed.

The network controller may include a communication interface suitable for enabling communication (e.g., TCP/IP) of data packets with other network devices 218 of network environment 100. For instance, the communication interface may be of a type suitable for communication over an IP network, a coaxial cable network, an HFC network, and/or wireless network, among others.

Figure 4:
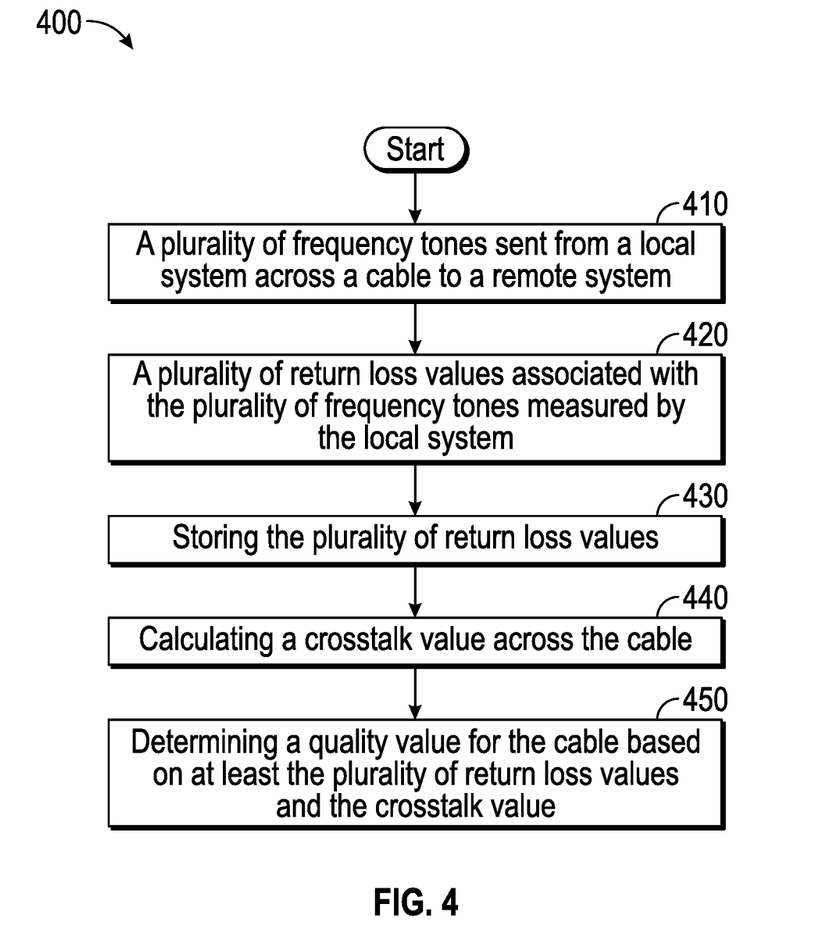
FIG. 4 is a flow chart illustrating embodiments of the present disclosure.

Having described various components of certain embodiments of network environment 100, a method 400 implemented by one or more network devices employed on network environment 100 will now be described with reference to FIG. 4. Method 400 may begin at step 410 where a plurality of frequency tones may be sent from a local system across a cable to a remote system. In some embodiments, the plurality of frequency tones may range from 10 MHz to 500 MHz. For example, the plurality of frequency tones may be sent to the remote system in 10 MHz steps.

Method 400 may next proceed to step 420. At step 420, a plurality of return loss values associated with sending the plurality of frequency tones may be measured by the local system.

Method 400 may next proceed to step 430. At step 430, the plurality of return loss values may be stored. In some embodiments, the plurality of return loss values may be stored by the remote PHY in a local SRAM. Method 400 may next proceed to step 440. At step 440, a crosstalk value may be calculated across the cable.

Finally method 400 may reach step 450. At step 450, a quality value for the cable may be determined based on at least the plurality of return loss values and the crosstalk value. In some embodiments, after the quality value is determined, auto-negotiation may then be performed at 1 GE across the cable. The auto-negotiation process may include sending extended Organizationally Unique Identifiers to the remote system. Through this process, the local system and the remote system may exchange insertion-loss and return loss values with one another. These values may be used to determine a maximum data rate to be used in final auto-negotiation.

Figure 5:
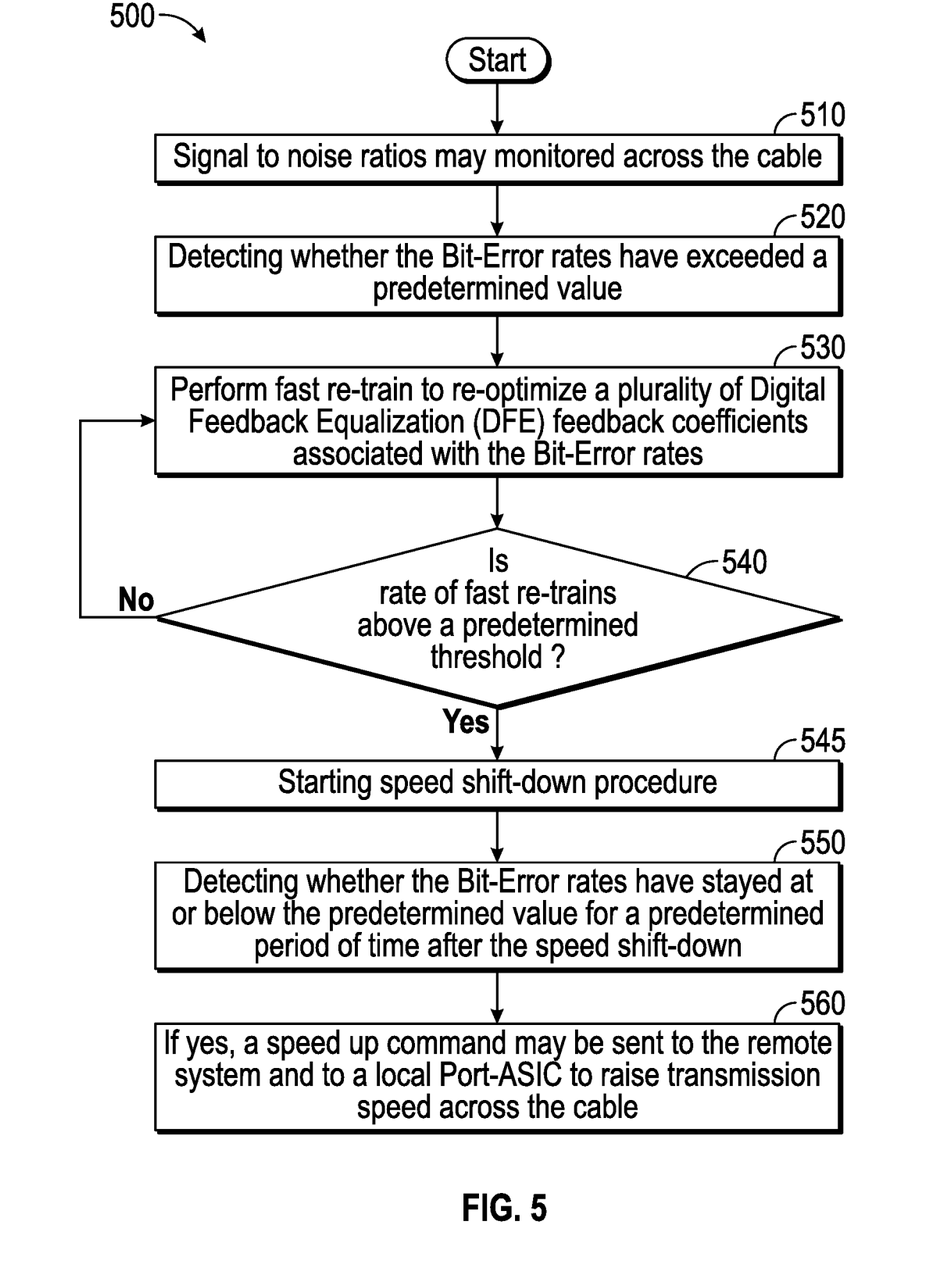
FIG. 5 is a flow chart illustrating embodiments of the present disclosure.

Once quality values have been determined, embodiments of the present disclosure may describe a method 500 implemented by one or more network devices employed on network environment 100 to provide in-service dynamic noise optimization as will now be described with reference to FIG. 5. Method 500 may begin at step 510 where signal to noise ratios may be monitored across the cable. Similarly, at step 510 Low Density Parity Check statuses may be monitored across the cable. Furthermore, Bit_error rates may also be monitored.

Method 500 may proceed to step 520. At step 520 it may be detected whether the Bit-Error rates have exceeded a predetermined value. In some embodiments, the predetermined value may be between $1 \times 10e^{-10}$ to $1 \times 10e^{-12}$ inclusive.

Method 500 may proceed to step 530. At step 530 a fast re-train may be performed to re-optimize a plurality of Digital Feedback Equalization (DFE) feedback coefficients associated with the Bit-Error rates. Subsequently, at step 540 it may be determined if a rate of fast re-trains is above a predetermined threshold. In some embodiments, the threshold may be one second.

If the rate of fast re-trains is above a predetermined threshold method 500 may proceed to step 545 where a speed shift-down procedure may be started. The speed shift-down procedure may comprise sending one or more messages to the remote system and to a local Port-ASIC to lower transmission speed across the cable. In some embodiments, the one or more messages to the remote system may indicate a desired speed in one or more AUX bits.

The messages themselves may comprise 16-PAM/DSQ128 or any other line coded frames. For example, in some embodiments, 000 may indicate 100M, 001 may indicate 1 G, 010 may indicate 2.5 G, 011 may indicate 5 G, and 100 may indicate 10 G. In some embodiments, the one or more messages to the local Port-ASIC may comprise at least a transmission status register and a transmission status word. Furthermore, an interrupt may be generated comprising an interrupt reason and mask register value.

Method 500 may proceed to step 550. At step 550, it may be detected whether the Bit-Error rates have stayed at or below the predetermined value for a predetermined period of time after the speed shift-down. If so, method 500 may proceed to step 560 where a speed up command may be sent to the remote system and to a local Port-ASIC to raise transmission speed across the cable. In some embodiments, the speed up command may indicate a last advertised speed.

Embodiments of the disclosure, for example, may be implemented as a computer process (method), a computing system, or as an article of manufacture, such as a non-transitory computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, floppy disks, or a CD-ROM, a carrier wave from the Internet, or other forms of RAM or ROM. Further, the disclosed methods' stages may be modified in any manner, including by reordering stages and/or inserting or deleting stages, without departing from the disclosure.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. A method comprising:
sending a plurality of frequency tones across a cable to a remote system wherein the plurality of frequency tones range from 10 MHz to 500 MHz and wherein the one or more messages to the remote system indicate a desired speed in one or more AUX bits;
measuring a plurality of return loss values associated with sending the plurality of frequency tones;
storing the plurality of return loss values;
computing a crosstalk value across the cable;
determining a quality value for the cable based on at least the plurality of return loss values and the crosstalk value; and
performing auto-negotiation at 1GE across the cable wherein performing the auto-negotiation comprises sending extended Organizationally Unique Identifiers to the remote system.

2. The method of claim 1, further comprising:
exchanging insertion-loss and return loss values with the remote system.

3. The method of claim 1, further comprising:
performing final auto-negotiation after agreeing with a maximum data rate with the remote system.

4. The method of claim 1, further comprising:
monitoring signal to noise ratios across the cable;
monitoring Low Density Parity Check statuses across the cable; and
monitoring Bit-Error rates across the cable.

5. The method of claim 4, further comprising:
detecting whether the Bit-Error rates have exceeded a predetermined value; and
performing a fast re-train to re-optimize a plurality of Digital Feedback Equalization (DFE) feedback coefficients associated with the Bit-Error rates.

6. The method of claim 5, further comprising:
determining if a rate of fast re-trains is above a predetermined threshold; and
starting a speed shift-down procedure if the rate of fast re-trains is above the predetermined threshold.

7. The method of claim 6, wherein the speed shift-down procedure further comprises:
sending one or more messages to the remote system and to a local Port-ASIC to lower transmission speed across the cable.

8. The method of claim 7, wherein the one or more messages to the remote system indicate a desired speed in one or more AUX bits.

9. The method of claim 8, wherein the one or more messages comprise 16-PAM frames.

10. The method of claim 7, wherein the one or more messages to the local Port-ASCI comprise at least a transmission status register and a transmission status word.

11. The method of claim 10, further comprising:
generating an interrupt comprising an interrupt reason and mask register value.

12. The method of claim 7, further comprising:
detecting whether the Bit-Error rates have stayed at or below the predetermined value for a predetermined period of time; and
sending a speed up command to the remote system and to the local Port-ASIC to raise transmission speed across the cable.

13. The method of claim 12, wherein the speed up command indicates a last advertised speed.

14. A method comprising:
sending a plurality of frequency tones across a cable to a remote system;
measuring a plurality of return loss values associated with sending the plurality of frequency tones;
storing the plurality of return loss values;
computing a crosstalk value across the cable;
determining a quality value for the cable based on at least the plurality of return loss values and the crosstalk value;
monitoring signal to noise ratios across the cable;
monitoring Low Density Parity Check statuses across the cable;
monitoring Bit-Error rates across the cable;
detecting whether the Bit-Error rates have exceeded a predetermined value;
performing a fast re-train to re-optimize a plurality of Digital Feedback Equalization (DFE) feedback coefficients associated with the Bit-Error rates;
determining when a rate of fast re-trains is above a predetermined threshold; and
starting a speed shift-down procedure when the rate of fast re-trains is above the predetermined threshold wherein the speed shift-down procedure comprises sending one or more messages to the remote system and to a local Port-ASIC to lower transmission speed across the cable wherein the one or more messages to the remote system indicate a desired speed in one or more AUX bits.

15. The method of claim 14, further comprising:
performing final auto-negotiation after agreeing with a maximum data rate with the remote system.

16. The method of claim 14, wherein the plurality of frequency tones range from 10 MHz to 500 MHz.

17. The method of claim 16, wherein the plurality of frequency tones are sent to the remote system in 10 MHz steps.

18. A system comprising:
a memory;
a processor capable of executing instructions stored on the memory, the instructions comprising:
send a plurality of frequency tones across a cable to a remote system;
measure a plurality of return loss values associated with sending the plurality of frequency tones;
store the plurality of return loss values;
compute a crosstalk value across the cable;
determine a quality value for the cable based on at least the plurality of return loss values and the crosstalk value;
monitor signal to noise ratios across the cable;
monitor Low Density Parity Check statuses across the cable;
monitor Bit-Error rates across the cable;
detect whether the Bit-Error rates have exceeded a predetermined value;

perform a fast re-train to re-optimize a plurality of Digital Feedback Equalization (DFE) feedback coefficients associated with the Bit-Error rates;

determine when a rate of fast re-trains is above a predetermined threshold;

start a speed shift-down procedure when the rate of fast re-trains is above the predetermined threshold wherein the speed shift-down procedure comprises sending one or more messages to the remote system and to a local Port-ASIC to lower transmission speed across the cable;

detect whether the Bit-Error rates have stayed at or below the predetermined value for a predetermined period of time; and send a speed up command to the remote system and to the local Port-ASIC to raise transmission speed across the cable wherein the speed up command indicates a last advertised speed.

19. The system of claim 18, wherein the plurality of frequency tones range from 10 MHz to 500 MHz.

20. The system of claim 19, wherein the plurality of frequency tones are sent to the remote system in 10 MHz steps.

* * * * *